(12) United States Patent
Kawahara et al.

(10) Patent No.: US 11,043,519 B2
(45) Date of Patent: Jun. 22, 2021

(54) IMAGE CAPTURING APPARATUS COMPRISING SILICON NITRIDE LAYER OF DIFFERENT CHLORINE CONCENTRATION, CAMERA, AND METHOD OF MANUFACTURING IMAGE CAPTURING APPARATUS

(71) Applicant: CANON KABUSHIKI KAISHA, Tokyo (JP)

(72) Inventors: Yuki Kawahara, Yokohama (JP); Masashi Kusukawa, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/028,586

(22) Filed: Jul. 6, 2018

(65) Prior Publication Data
US 2019/0035826 A1 Jan. 31, 2019

(30) Foreign Application Priority Data
Jul. 27, 2017 (JP) .............................. JP2017-145682

(51) Int. Cl.
| | | |
|---|---|---|
| *H01L 27/146* | (2006.01) | |
| *H01L 31/0216* | (2014.01) | |
| *H01L 31/18* | (2006.01) | |
| *H01L 21/285* | (2006.01) | |
| *H01L 29/51* | (2006.01) | |
| *H01L 29/66* | (2006.01) | |
| *H01L 29/78* | (2006.01) | |

(52) U.S. Cl.
CPC .... *H01L 27/1462* (2013.01); *H01L 21/28518* (2013.01); *H01L 27/14612* (2013.01); *H01L 27/14685* (2013.01); *H01L 29/518* (2013.01); *H01L 31/0216* (2013.01); *H01L 29/6659* (2013.01); *H01L 29/7843* (2013.01); *H01L 31/18* (2013.01); *H01L 2924/01017* (2013.01)

(58) Field of Classification Search
CPC .......... H01L 27/14612; H01L 27/1462; H01L 27/14685; H01L 31/0216; H01L 31/18; H01L 2924/01017; H01L 21/28518; H01L 29/518
See application file for complete search history.

(56) References Cited

U.S. PATENT DOCUMENTS 5,291,052 A * 3/1994 Kim ................ H01L 21/823864
257/346
8,982,254 B2 3/2015 Shoyama
(Continued)

FOREIGN PATENT DOCUMENTS

| JP | 2013-84693 A | 5/2013 |
|---|---|---|
| JP | 2015-126114 A | 7/2015 |
| JP | 2016-92203 A | 5/2016 |

*Primary Examiner* — Eduardo A Rodela
*Assistant Examiner* — Christopher M Roland
(74) *Attorney, Agent, or Firm* — Venable LLP (57) ABSTRACT

An image capturing apparatus where a pixel region that includes a photoelectric converter and a peripheral region that includes a transistor are arranged in a substrate is provided. The photoelectric converter is covered with a first silicon nitride layer, a side surface of a gate electrode of the transistor is covered with a side wall that include a second silicon nitride layer, and the first silicon nitride layer has a lower chlorine concentration than the second silicon nitride layer has.

19 Claims, 7 Drawing Sheets

(56) References Cited

U.S. PATENT DOCUMENTS

| | | | |
|---|---|---|---|
| 9,893,114 B2 | 2/2018 | Endo | |
| 9,917,135 B2 | 3/2018 | Kusukawa | |
| 2005/0189606 A1* | 9/2005 | Nakagawa | H01L 27/115 257/500 |
| 2006/0022228 A1* | 2/2006 | Hoshi | C23C 16/345 257/288 |
| 2007/0200203 A1* | 8/2007 | Fukuda | H01L 21/02532 257/632 |
| 2008/0157144 A1* | 7/2008 | Lee | H01L 27/14687 257/292 |
| 2008/0237666 A1* | 10/2008 | Kido | H01L 27/14689 257/290 |
| 2010/0320545 A1* | 12/2010 | Jagannathan | H01L 21/823431 257/392 |
| 2011/0244627 A1* | 10/2011 | Okabe | H01L 21/28518 438/98 |
| 2013/0334641 A1* | 12/2013 | Suzuki | H01L 31/02325 257/432 |
| 2015/0214269 A1 | 7/2015 | Endo | |
| 2016/0126284 A1 | 5/2016 | Kato et al. | |
| 2017/0287974 A1* | 10/2017 | Kusukawa | H01L 27/14689 |
| 2018/0070041 A1* | 3/2018 | Hirota | H04N 5/374 |
| 2019/0019833 A1* | 1/2019 | Kodaira | H04N 5/369 |

* cited by examiner

IMAGE CAPTURING APPARATUS COMPRISING SILICON NITRIDE LAYER OF DIFFERENT CHLORINE CONCENTRATION, CAMERA, AND METHOD OF MANUFACTURING IMAGE CAPTURING APPARATUS

BACKGROUND OF THE INVENTION

Field of the Invention

The present invention relates to an image capturing apparatus, a camera, and a method of manufacturing the image capturing apparatus.

Description of the Related Art

In an image capturing apparatus, there is an interface state (dangling bond) formed at the interface between a semiconductor substrate and an insulating film as one of causes of noise such as a white spot or a dark current in a pixel region. In order to reduce the noise caused by the dangling bond, Japanese Patent Laid-Open No. 2013-84693 describes a technique of terminating a dangling bond by arranging a silicon nitride layer that contains a large amount of hydrogen above a pixel region and supplying hydrogen to the surface of a photoelectric converter such as a photodiode.

In a manufacturing method of Japanese Patent Laid-Open No. 2013-84693, a side wall of a gate electrode of a transistor arranged in a peripheral region is formed by using a silicon nitride layer for supplying hydrogen to a pixel region. Japanese Patent Laid-Open No. 2013-84693 also describes a technique of using hexachlorodisilane (HCD) as a source gas when forming the silicon nitride layer for supplying hydrogen to the pixel region.

SUMMARY OF THE INVENTION

The present inventors found that the characteristics of a pixel region or the characteristics of a peripheral region such as a dark current generated in a photoelectric converter change depending on a material for a silicon nitride layer.

The present invention provides a technique advantageous in improving the characteristics of an image capturing apparatus.

According to some embodiments, an image capturing apparatus where a pixel region that includes a photoelectric converter and a peripheral region that includes a transistor are arranged in a substrate, wherein the photoelectric converter is covered with a first silicon nitride layer, a side surface of a gate electrode of the transistor is covered with a side wall that include a second silicon nitride layer, and the first silicon nitride layer has a lower chlorine concentration than the second silicon nitride layer has, is provided.

According to some other embodiments, an image capturing apparatus where a pixel region that includes a photoelectric converter and a peripheral region that includes a transistor are arranged in a substrate, wherein the photoelectric converter is covered with a first silicon nitride layer, a side surface of a gate electrode of the transistor is covered with a side wall that include a silicon oxide layer, and the side wall does not include a second silicon nitride layer whose chlorine concentration is not more than a chlorine concentration of the first silicon nitride layer, is provided.

According to some other embodiments, a method of manufacturing an image capturing apparatus where a pixel region and a peripheral region are arranged, the method comprising: forming a first insulating film on at least a photoelectric converter of the pixel region and on a gate electrode of the peripheral region; forming a mask pattern configured to cover a portion located on at least the photoelectric converter of the first insulating film; removing the first insulating film of a portion uncovered with the mask pattern; forming a second insulating film above the pixel region and the peripheral region after the removing; and forming a side wall configured to cover the side surface of the gate electrode from the second insulating film by etching the second insulating film, is provided.

Further features of the present invention will become apparent from the following description of exemplary embodiments (with reference to the attached drawings).

DESCRIPTION OF THE EMBODIMENTS

A detailed embodiment of a method of manufacturing an image capturing apparatus according to the present invention will be described below with reference to the accompanying drawings. Note that in the following explanation and drawings, common reference numerals denote common components throughout a plurality of drawings. For this reason, the common components will be described by cross-referencing the plurality of drawings, and a description of components denoted by common references numeral will appropriately be omitted.

The structure and a manufacturing method of the image capturing apparatus according to an embodiment of the present invention will be described with reference to FIGS. 1A to 4C. FIGS. 1A to 4B are sectional views each showing a step of the method of manufacturing the image capturing apparatus according to the embodiment of the present invention. FIG. 4C is a sectional view showing the structure of the image capturing apparatus according to the embodiment of the present invention. For a descriptive purpose, FIGS. 1A to 4C illustrate a pixel region 101 and a peripheral region 102 adjacent to each other. A pixel circuit is arranged in the pixel region 101, and a peripheral circuit such as a driving circuit, a signal processing circuit, or a control circuit is arranged in the peripheral region 102. The pixel circuit can be formed by a source follower circuit. The peripheral circuit can be formed by a CMOS circuit. A substrate 100 where the image capturing apparatus is formed will be described as a semiconductor substrate having an n conductivity type. However, conductivity types such as the conductivity types of respective constituent elements to be described below may be opposite from each other.

The image capturing apparatus is formed in and on the substrate 100. The substrate 100 may be an n-type semiconductor substrate of silicon or the like. Alternatively, the image capturing apparatus may be formed in an n-type well provided on the semiconductor substrate and on a well. Alternatively, the image capturing apparatus may be formed in an n-type semiconductor layer provided on an insulating substrate of glass, a plastic, or the like and on a semiconductor layer.

Figure 1A:
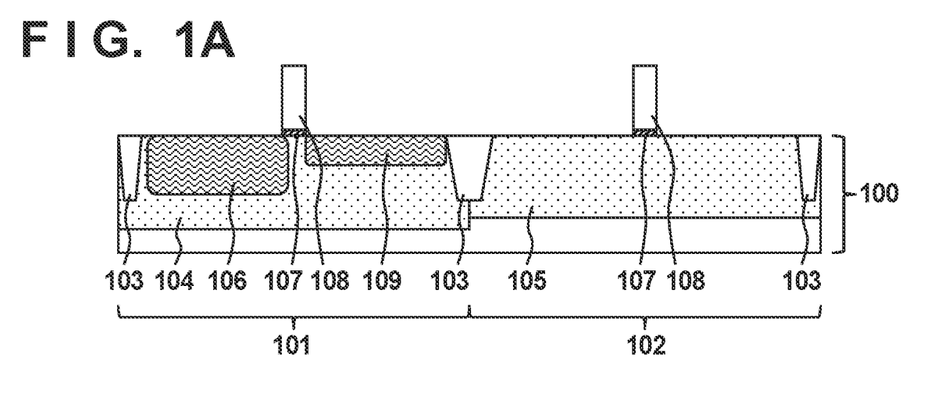
FIGS. 1A to 1F are sectional views showing a method of manufacturing an image capturing apparatus according to an embodiment of the present invention.

First, an element isolation region 103 formed by an STI, a local oxidation of silicon (LOCOS) method, or the like, and p-type wells 104 and 105 formed in the pixel region 101 and the peripheral region 102 are arranged in the substrate 100 as shown in FIG. 1A. An n-type semiconductor region 106 is arranged in the pixel region 101. The semiconductor region 106 forms a p-n junction with the well 104 and functions as a photoelectric converter. After the element isolation region 103, the wells 104 and 105, and the semiconductor region 106 are formed, a gate insulating film 107 and a gate electrode 108 formed by a polysilicon film are formed in each of the pixel region 101 and the peripheral region 102. After the polysilicon film is deposited so as to cover the entire surface of the substrate 100 that includes the pixel region 101 and the peripheral region 102, each gate electrode 108 forms a mask pattern in a portion where the polysilicon film remains as the gate electrode 108. Subsequently, the gate electrode 108 is formed in each of the pixel region 101 and the peripheral region 102 as shown in FIG. 1A by removing the polysilicon film uncovered with the mask pattern by using dry etching or the like. At this time, the gate electrodes 108 may be formed simultaneously in both regions of the pixel region 101 and the peripheral region 102. By forming the gate electrodes 108 simultaneously in the pixel region 101 and the peripheral region 102, the number of steps is reduced as compared with a case in which the gate electrodes 108 are formed separately in the respective regions, making it possible to suppress a manufacturing cost.

After the gate electrodes 108 are formed, an n-type semiconductor region 109 is formed by using a mask pattern using a photoresist or the like and implanting an n-type impurity. The semiconductor region 109 can play the role of a floating diffusion or the source/drain region of a transistor arranged in another pixel region. The element isolation region 103, the wells 104 and 105, the semiconductor region 106, the gate insulating film 107, and the gate electrodes 108 can be formed by known manufacturing methods.

Figure 1B:
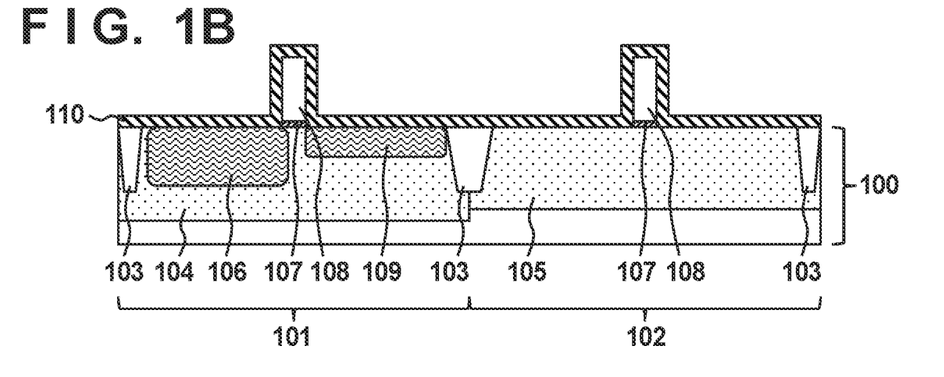
Figure 1C:
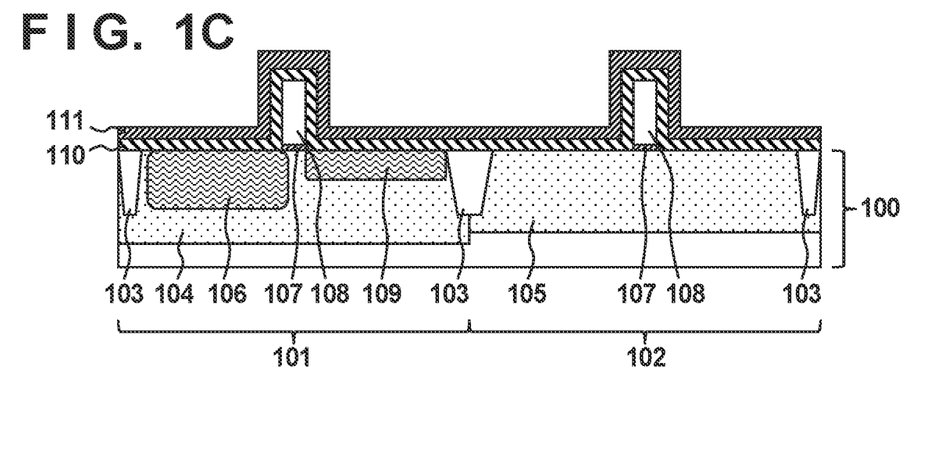

Next, as shown in FIG. 1B, a silicon oxide layer 110 is formed above the pixel region 101 and above the peripheral region 102. Then, as shown in FIG. 1C, a silicon nitride layer 111 is formed so as to cover the silicon oxide layer 110 above the pixel region 101 and the peripheral region 102. The silicon oxide layer 110 may be formed by a low-pressure CVD method using a source gas that contains, for example, tetraethoxysilane (TEOS). The silicon nitride layer 111 may be formed by the low-pressure CVD method using a source gas that contains, for example, dichlorosilane (DCS). By the steps shown in FIGS. 1B and 1C, an insulating film which includes the silicon oxide layer 110 and the silicon nitride layer 111 is formed on at least the photoelectric converter of the pixel region 101 and on at least the gate electrode 108 of the peripheral region 102.

In this embodiment, silicon nitride means a compound of nitrogen (N) and silicon (Si), the compound containing nitrogen (N) and silicon (Si) as elements other than light elements, which occupy top two of the composition ratio of constituent elements of the compound. Silicon nitride can contain a light element such as hydrogen (H) or helium (He), and its amount (atom %) may be larger or smaller than those of nitrogen (N) and silicon (Si). Silicon nitride can contain nitrogen (N), silicon (Si), and an element other than a light element at a concentration lower than those of nitrogen (N) and silicon (Si). Typical elements that can be contained in silicon nitride are boron (B), carbon (C), oxygen (O), fluorine (F), phosphorus (P), chlorine (Cl), and argon (Ar). When an element other than a light element which has the third largest amount out of constituent elements of silicon nitride is oxygen, this silicon nitride can be referred to as silicon oxynitride or oxygen-containing silicon nitride. Similarly, silicon oxide means a compound of oxygen (O) and silicon (Si), the compound containing oxygen (O) and silicon (Si) as elements other than light elements, which occupy top two of the composition ratio of constituent elements of the compound. Typical elements that can be contained in silicon oxide are hydrogen (H), helium (He), boron (B), carbon (C), nitrogen (N), fluorine (F), phosphorus (P), chlorine (Cl), and argon (Ar). When an element other than a light element which has the third largest amount out of constituent elements of silicon oxide is nitrogen, this silicon oxide can be referred to as silicon nitride oxide or nitrogen-containing silicon oxide. Note that an element contained in a constituent member of the image capturing apparatus can be analyzed by energy dispersive X-ray spectrometry (EDX) or the like. A hydrogen content can be analyzed by elastic recoil detection analysis (ERDA) method or the like.

The silicon nitride layer 111 contains a large amount of hydrogen and terminates a dangling bond by supplying hydrogen to the surface of a photoelectric converter such as a photodiode. On the other hand, the present inventors found that a dark current generated in the photoelectric converter is reduced as the chlorine concentration of the silicon nitride layer 111 that covers the photoelectric converter become lower. Therefore, when forming the silicon nitride layer 111, process conditions on which the film of the silicon nitride layer 111 contains chlorine as little as possible is used to form the silicon nitride layer 111. Various processing conditions such as a temperature when the silicon nitride layer 111 is formed, the flow rate ratio of respective source gasses contained in a process gas, the flow rate ratio of a source gas and a carrier gas other than the source gas, and the like may be adjusted. The chlorine concentration of the silicon nitride layer 111 to be formed may be, for example, less than 1.0 atom %, or may be less than 0.7 atom % or further less than 0.2 atom %. Alternatively, the silicon nitride layer 111 may not contain chlorine. The silicon nitride layer 111 formed by such a method can be a film which has a low chlorine concentration or does not contain chlorine. This makes it possible to suppress the dark current in the photoelectric converter of the pixel region 101 and reduce noise. The chlorine concentration of the silicon nitride layer 111 can be analyzed by, for example, Rutherford Back-Scattering Spectroscopy (RBS) or the like.

It is possible to obtain an appropriate antireflection structure in the photoelectric converter by arranging the silicon oxide layer 110 that serves as an insulating film having a lower refractive index than the silicon nitride layer 111 between the substrate 100 and the silicon nitride layer 111. The insulating film of a multi-layered film that includes the silicon nitride layer 111 and the silicon oxide layer 110 implementing the antireflection structure is not limited to this structure. For example, the gate insulating film 107 may be arranged between the substrate 100 and the silicon oxide layer 110 on the semiconductor region 106 of the photoelectric converter. The gate insulating film 107 may be made of, for example, silicon oxide, silicon oxynitride, or various high dielectric constant insulators. A material can be selected as needed in accordance with a capability required of each switch element such as a transistor of the pixel region 101 and the peripheral region 102. In this embodiment, the silicon oxide layer 110 is arranged between the silicon nitride layer 111 and the substrate 100. However, the present invention is not limited to this, and another insulating layer may be arranged instead of the silicon oxide layer 110 as long as the appropriate antireflection structure can be obtained in the photoelectric converter. For example, an organic material layer or the like using an organic material having a lower refractive index than the silicon nitride layer 111 may be used instead of the silicon oxide layer 110.

Figure 1D:
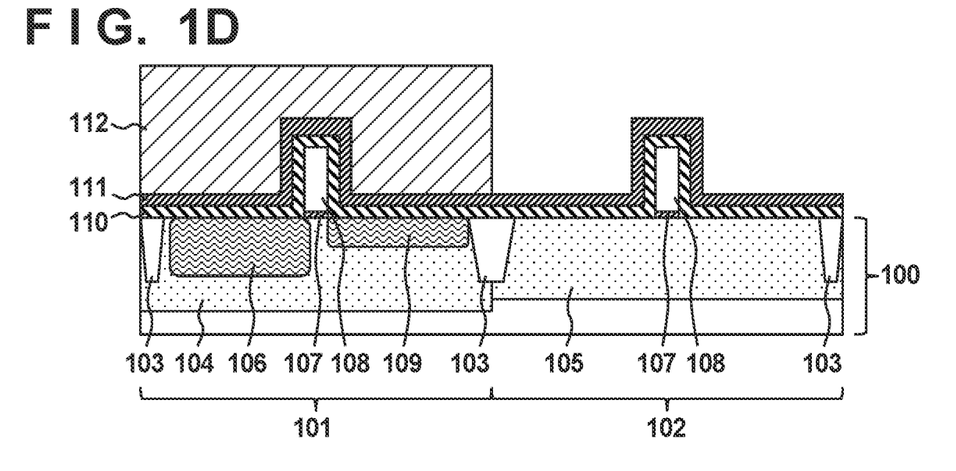

After the silicon oxide layer 110 and the silicon nitride layer 111 are formed, a mask pattern 112 is formed as shown in FIG. 1D. In place of a photoresist, a hard mask formed by processing an inorganic material film of silicon oxide or the like may be used as a material for the mask pattern 112. The mask pattern 112 covers at least a portion located above the photoelectric converter of the pixel region 101 out of the insulating film that includes the silicon oxide layer 110 and the silicon nitride layer 111. In this embodiment, as shown in FIG. 1D, the entire pixel region 101 is covered with the mask pattern 112.

Figure 1E:
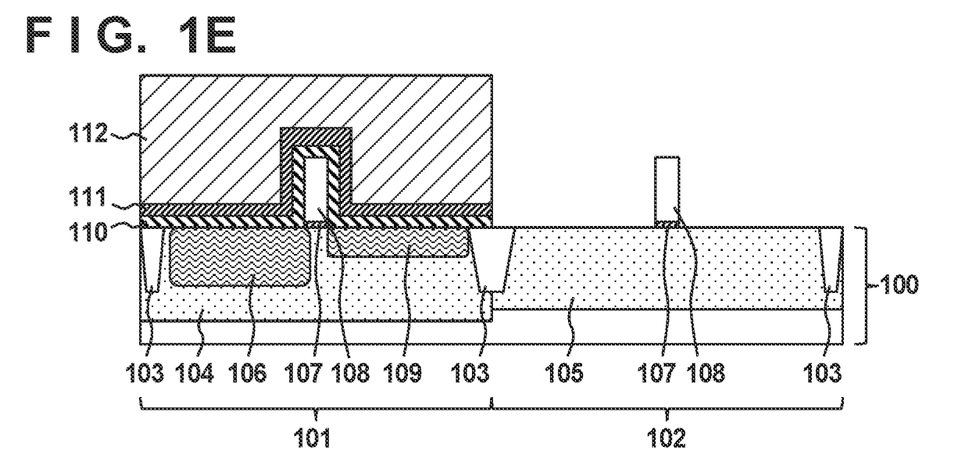

Next, as shown in FIG. 1E, by wet etching the insulating film that includes the silicon oxide layer 110 and the silicon nitride layer 111 of a portion uncovered with the mask pattern 112, the silicon nitride layer 111 and the silicon oxide layer 110 of the portion are removed. A case will be described in which the hard mask of silicon oxide is used as the mask pattern 112 in this etching process. First, a silicon oxide layer is formed on the silicon nitride layer 111, a mask pattern using a photoresist is formed thereon, and a silicon oxide layer in a region where the mask pattern opens is removed. Then, the mask pattern 112 of silicon oxide can be formed by removing the photoresist. After the mask pattern 112 using silicon oxide is formed, it is possible to selectively remove the silicon nitride layer 111 in a region uncovered with the mask pattern 112 of silicon oxide by performing wet etching using a chemical solution that contains phosphoric acid. Subsequently, the silicon oxide layer 110 in a region where the silicon nitride layer 111 opens is removed by performing a hydrofluoric acid treatment (wet etching using hydrofluoric acid). This makes it possible to obtain a structure shown in FIG. 1E where the insulating film that includes the silicon nitride layer 111 and the silicon oxide layer 110 of the peripheral region 102 is removed.

In the etching process of removing the insulating film that includes the silicon nitride layer 111 and the silicon oxide layer 110 of the peripheral region 102, it is also possible to select a method of removing the film by dry etching. Considering damage given to the substrate 100, however, the damage can further be reduced in wet etching than in dry etching. In this etching process, the mask pattern 112 needs to cover at least the photoelectric converter. Here, consider, for example, damage when removing the silicon nitride layer 111 and the silicon oxide layer 110, a phenomenon in which the edges of the silicon nitride layer 111 and the silicon oxide layer 110 retreat, in a case in which wet etching is used as described above, or the like. In this case, it is considered that, as the mask pattern 112, a large pattern that covers the entire pixel region 101 is better suited than a fine pattern layout that covers only the photoelectric converter. Taking these into account collectively, the mask pattern 112 may cover not only the photoelectric converter but also the entire pixel region 101 as shown in FIGS. 1D and 1E.

Figure 1F:
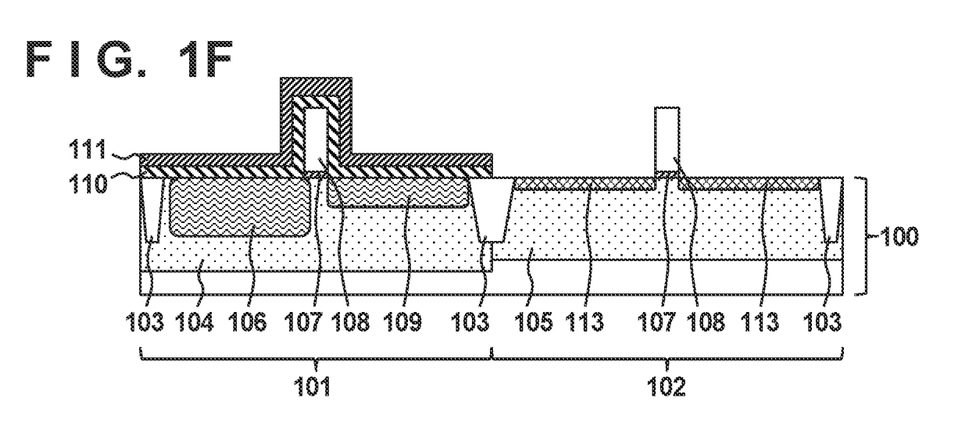

Then, as shown in FIG. 1F, n-type semiconductor regions 113 serving as the LDD (Light Doped Drain) of the transistor in the peripheral region 102 are formed by implanting an impurity by an ion implantation method. They can be formed by a general formation method for a CMOS transistor or the like, or another known method. Formation of the semiconductor regions 113 is not essential. It is also possible to form the semiconductor regions 113 before the silicon nitride layer 111 and the silicon oxide layer 110 are formed. In order to have a finer structure in the peripheral region 102, however, it is possible to form the semiconductor regions 113 by self alignment by performing a process in the above-described order. The semiconductor regions 113 may be n-type semiconductor regions or p-type semiconductor regions, or the n- and p-type semiconductor regions may coexist. After the semiconductor regions 113 are formed, or while the semiconductor regions 113 are formed, annealing at a temperature of about 700° C. to 1,100° C. may be performed in order to recover from an implantation failure by ion implantation for forming the semiconductor regions 113.

Figure 2A:
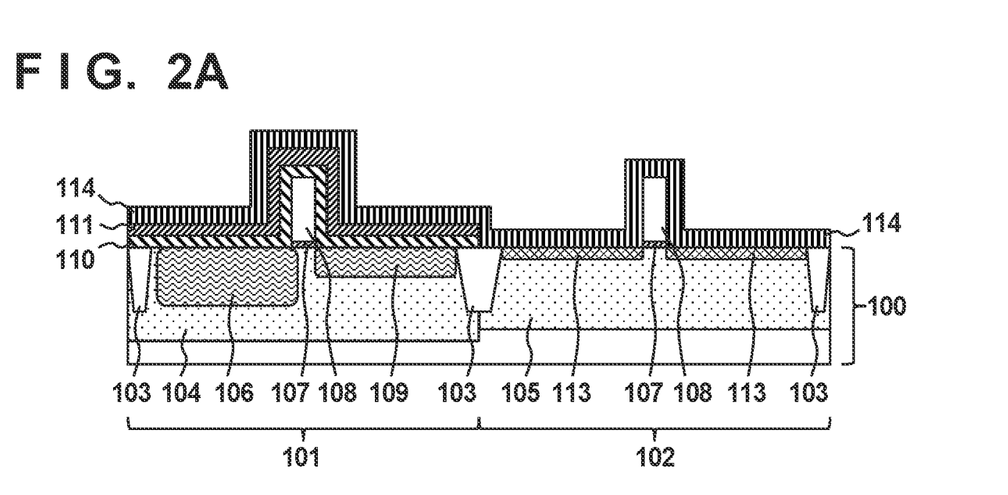
FIGS. 2A to 2E are sectional views showing the method of manufacturing the image capturing apparatus according to the embodiment of the present invention.
Figure 3A:
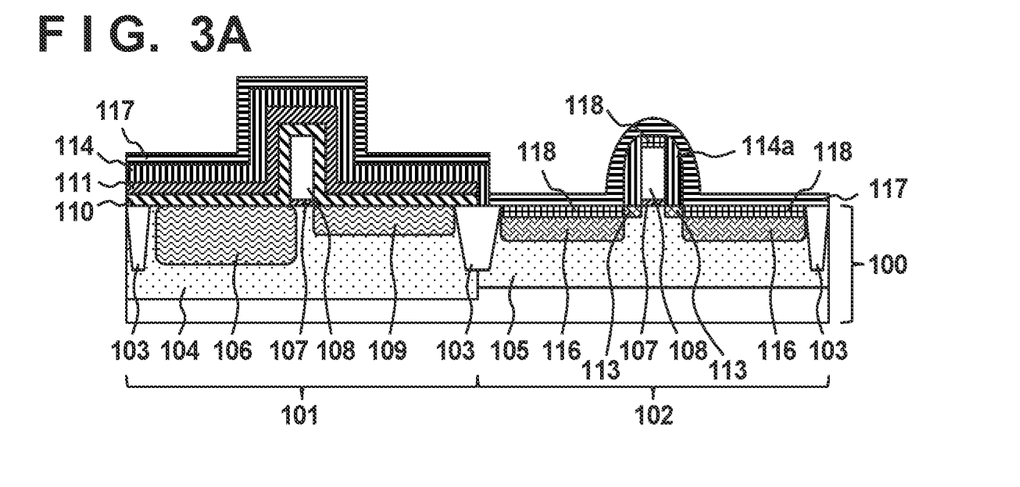
FIGS. 3A to 3E are sectional views showing the method of manufacturing the image capturing apparatus according to the embodiment of the present invention.

After the etching process for the insulating film that includes the silicon nitride layer 111 and the silicon oxide layer 110 shown in FIG. 1E, and formation of the semiconductor regions 113 shown in FIG. 1F, an insulating film 114 is formed above the pixel region 101 and the peripheral region 102 as shown in FIG. 2A. The insulating film 114 may be, for example, a single-layered film of a silicon oxide layer using silicon oxide. In other words, the insulating film 114 may not contain silicon nitride as a material that forms the insulating film 114. When the insulating film 114 is the silicon oxide layer, the insulating film 114 may be formed by a method such as a low-pressure CVD method using a process gas that contains tetraethoxysilane (TEOS) as a source gas.

Alternatively, the insulating film 114 may be a multi-layered film that includes a silicon nitride layer or may be a silicon nitride layer. When the insulating film 114 is the multi-layered film that includes the silicon nitride layer, a structure or the like that stacks, for example, the silicon oxide layer and the silicon nitride layer is considered as the insulating film 114. Alternatively, the insulating film 114 may be formed by only the silicon nitride layer. Silicon nitride used as the insulating film 114 may be silicon nitride having a film quality different from that of the above-described silicon nitride layer 111.

Silicon nitride used for the insulating film 114 will be described here. The present inventors found that when a side wall for a transistor of the peripheral region 102 is formed from silicon nitride that contains chlorine, the driving capability of the transistor improves as the chlorine concentration of silicon nitride becomes higher. Therefore, when silicon nitride is used for the insulating film 114 to be a side wall that cover the side surface of the gate electrode 108 in the peripheral region 102 in a step to be described later, silicon nitride may be formed on a deposition condition different from that of the silicon nitride layer 111 having the low chlorine concentration as described above. Silicon nitride used for the insulating film 114 may be formed by, for example, a low-pressure CVD method by using a process gas that contains hexachlorodisilane (HCD) as a source gas. In other words, at least some of source gasses used at the time of deposition may be different between the silicon nitride layer 111 and the silicon nitride layer that forms the insulating film 114. Note that the silicon nitride layer used for the insulating film 114 is formed by adjusting a deposition temperature, the mixed gas ratio of the process gas, or the like in order to increase the chlorine concentration in the film. The chlorine concentration of the silicon nitride layer of the insulating film 114 thus obtained may be, for example, 1.0 atom % or more, or may further be 1.5 atom % or more, or 2.0 atom % or more. That is, when silicon nitride is used for the insulating film 114, this silicon nitride may have a higher chlorine concentration than the silicon nitride layer 111. In other words, silicon nitride used for the insulating film 114 may not contain silicon nitride having a chlorine concentration equal to or lower than that of the silicon nitride layer 111. For example, when the silicon nitride layer used for the insulating film 114 is formed on the same condition as the silicon nitride layer 111, a silicon nitride layer having a film thickness different from that of the silicon nitride layer 111 may be formed as the insulating film 114. In this case, it becomes possible to supply a larger amount of chlorine to the transistor of the peripheral region 102 than the pixel region 101 by depositing a silicon nitride layer thicker than the silicon nitride layer 111 as the insulating film 114.

When forming the insulating film 114, it is possible to suppress diffusion of an impurity in the semiconductor regions 113 by forming the insulating film 114 on a condition of a temperature as low as possible or a condition of a time as short as possible in order to suppress diffusion of the impurity implanted into the semiconductor regions 113. The insulating film 114 can be formed on a condition where, for example, a thermal history equal to or less than that in deposition of the silicon oxide layer 110 and the silicon nitride layer 111 is obtained. In other words, a condition on which the silicon oxide layer 110 and the silicon nitride layer 111 are formed does not influence the semiconductor regions 113, and thus a condition on which the diffusion length of an impurity becomes greater than in the insulating film 114 may be adopted. For example, a temperature when the insulating film that includes the silicon oxide layer 110 and the silicon nitride layer 111 is formed may be higher than a temperature when the insulating film 114 is formed. This makes it possible to effectively recover from a failure owing to damage to the pixel region 101 in formation of the gate electrode 108, and the semiconductor regions 106 and 109.

Figure 2B:
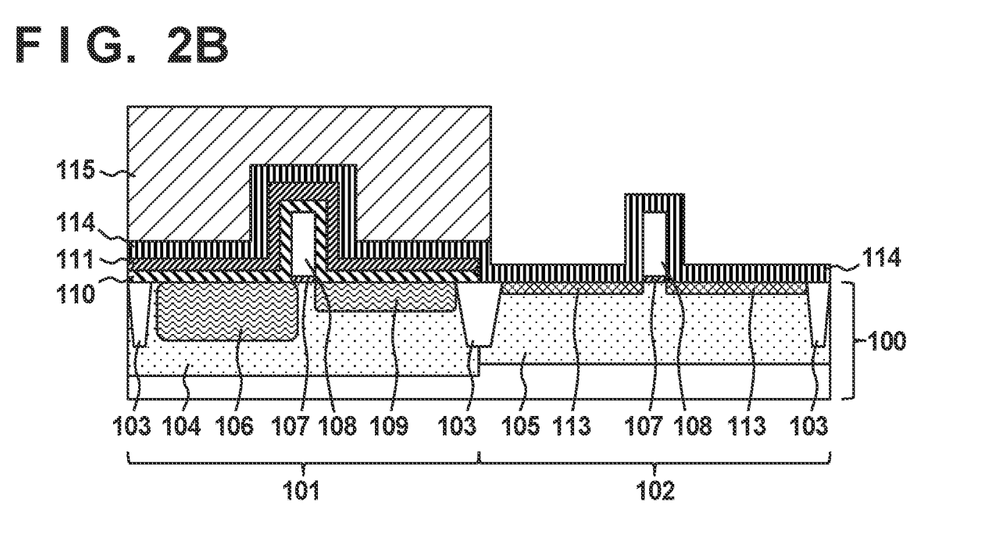

A mask pattern 115 is formed after the insulating film 114 is formed. The mask pattern 115 may cover the entire pixel region 101 as shown in FIG. 2B. The mask pattern 115 may not cover the peripheral region 102 as shown in FIG. 2B or may cover a partial region of the peripheral region 102 where a side wall is not formed on the side surface of the gate electrode 108. In other words, it is only necessary that the insulating film 114 remaining as the side wall of the gate electrode 108 arranged in the transistor of the peripheral region 102 is not covered with the mask pattern 115.

Figure 2C:
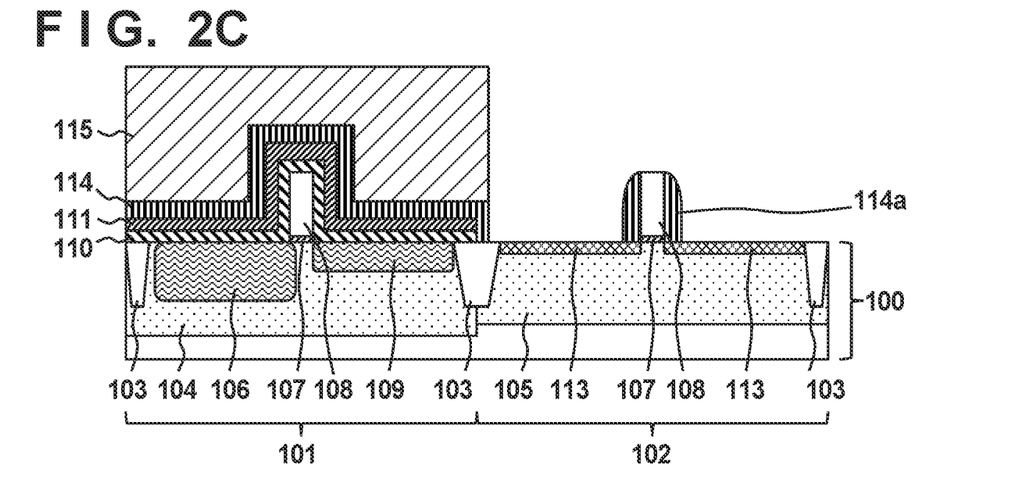

After the mask pattern 115 is formed, the insulating film 114 is etched back by dry etching through an opening portion uncovered with the mask pattern 115. With this step, as shown in FIG. 2C, the side wall 114a that cover the side surface of the gate electrode 108 are formed from the insulating film 114 by etching the insulating film 114. In this step, the insulating film 114 which is covered with the mask pattern 115, and thus is not etched back covers at least the photoelectric converter of the pixel region 101. This makes it possible to enhance an effect of preventing a metal from diffusing in the insulating film formed by the silicon oxide layer 110 and the silicon nitride layer 111, and reaching the photoelectric converter in a step of forming a silicide layer to be described later.

In this embodiment, an arrangement in which the mask pattern 115 covers the pixel region 101 has been described. However, a step of forming the mask pattern 115 may be omitted. A side wall structure by the insulating film 114 is formed on the silicon nitride layer 111 of the pixel region 101 by etching back the entire surfaces of the pixel region 101 and the peripheral region 102 without using the mask pattern 115. In this case, a photolithography process for forming the mask pattern 115 can be omitted, making it possible to obtain an effect of shortening a work period or reducing a cost in the generally known manufacture. Furthermore, it is possible to obtain an effect of, for example, improving step coverage of an interlayer insulating film or the like stacked on a structure after this step.

Figure 2D:
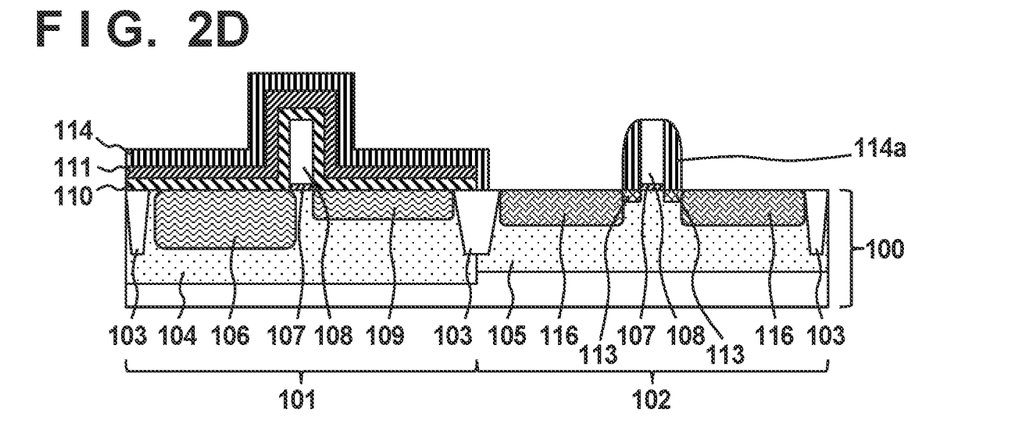

After the side walls 114a are formed, the mask pattern 115 is removed and as shown in FIG. 2D, n-type semiconductor regions 116 which make the source/drain regions in an LDD structure of the transistor arranged in the peripheral region 102 are formed by implanting an impurity by the ion implantation method. If the source/drain regions do not have the LDD structure, the implantation amount of the impurity when the semiconductor regions 113 are formed is adjusted as needed, and the semiconductor regions 116 may not be formed.

Figure 2E:
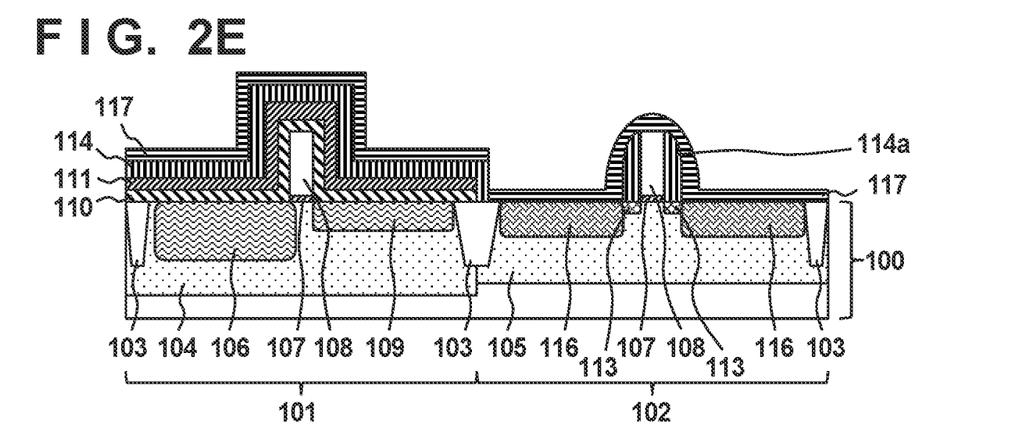

Then, as shown in FIG. 2E, a metal film 117 of cobalt, nickel, or the like is formed on the substrate 100 so as to cover the pixel region 101 and the peripheral region 102. After the metal film 117 is formed, as shown in FIG. 3A, a silicide forming process of performing silicidation on a portion of the substrate 100 and the gate electrodes 108 in contact with the metal film 117 is performed. More specifically, the metal film 117 is made to react with the gate electrode 108, and semiconductor regions 113 and 116 of the peripheral region 102, forming silicide layers 118. As shown in FIG. 3A, the transistor including the gate electrode 108 can include the silicide layers 118 at least a part of the source/drain regions made of the semiconductor regions 113 and 116 and the gate electrode 108. In the silicide forming process of forming these silicide layers 118, at least the edge of the insulating film that includes the silicon nitride layer 111 and the silicon oxide layer 110 is covered with the insulating film 114. As shown in FIG. 3A, the entire insulating film that includes the silicon nitride layer 111 and the silicon oxide layer 110 may be covered with the insulating film 114. As a result, in orthogonal projection to the substrate 100, a structure is obtained in which the silicide layers 118, and the insulating film that includes the silicon nitride layer 111 and the silicon oxide layer 110 are separated from each other without overlapping. This makes it possible to prevent a metal to undergo silicidation from reaching the photoelectric converter by diffusing the metal in the insulating film that includes the silicon oxide layer 110 and the silicon nitride layer 111. As a result, it is possible to suppress an increase in dark current (white spot) generated by metal atoms taken into the photoelectric converter.

Figure 3B:
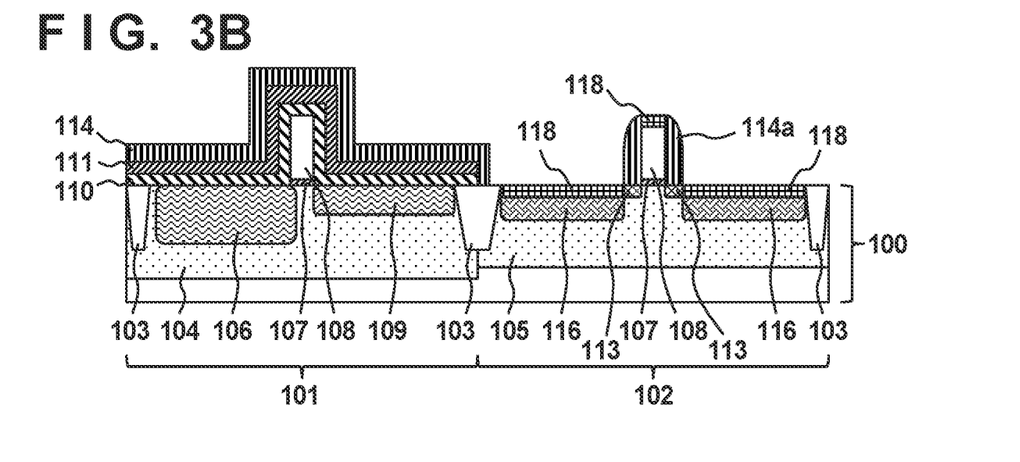

After the silicide layers 118 are formed, as shown in FIG. 3B, the unreacted metal film 117 on the insulating film 114 and side walls 114a is removed. By these steps, the silicide layers 118 are formed on the surfaces of the source/drain regions made of the semiconductor regions 113 and 116, and the gate electrode. The silicide layers 118 are formed on the surfaces of the gate electrode 108, and the semiconductor regions 113 and 116 in this embodiment, but may be formed on, for example, only the surface of the gate electrode 108 or only the surfaces of the semiconductor regions 113 and 116. Alternatively, the silicide layers 118 may be formed in all transistors arranged in the peripheral region 102, or the silicide layers 118 may be formed in only some of the transistors. A region of the peripheral region 102 where the silicide layers 118 are formed may be selected as needed in accordance with a capability required of each transistor arranged in the peripheral region 102.

Figure 3C:
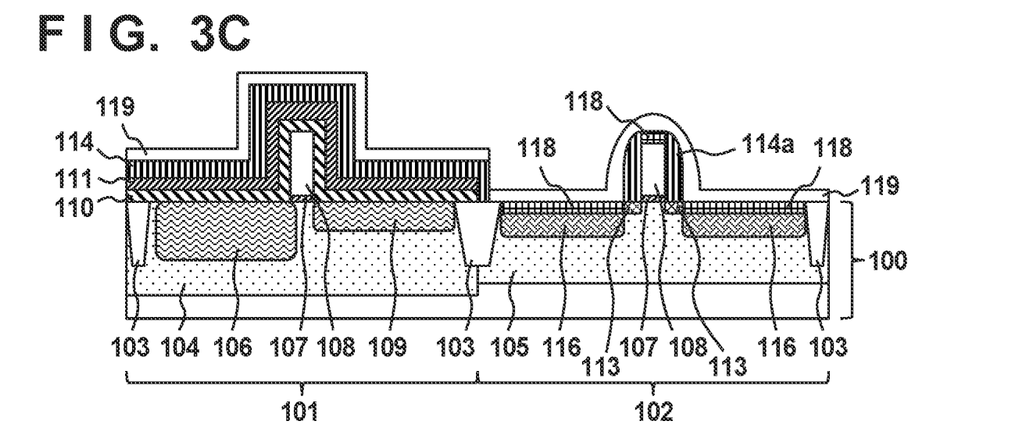
Figure 3D:
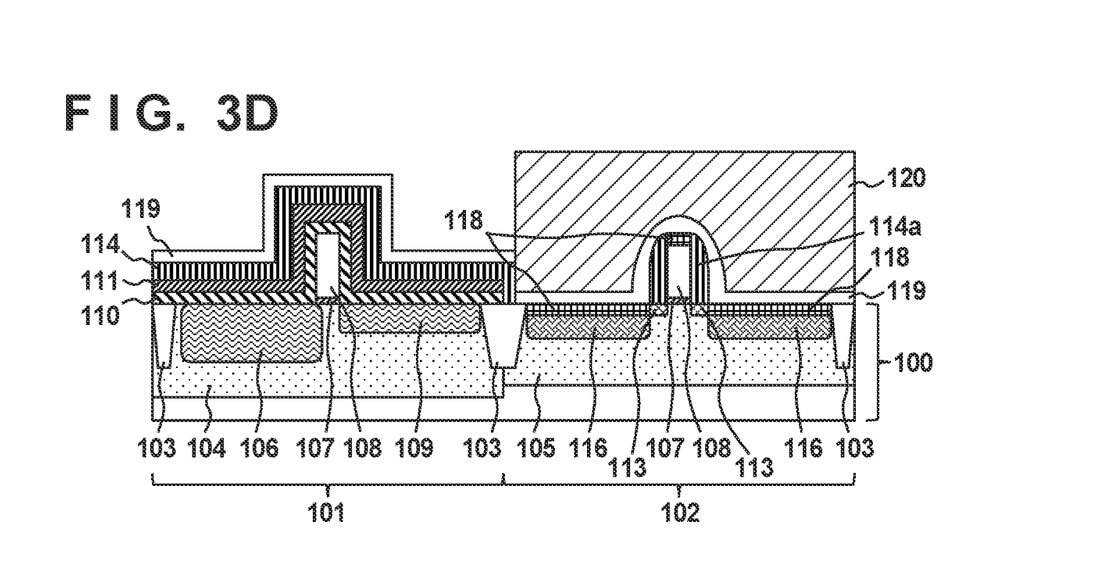
Figure 3E:
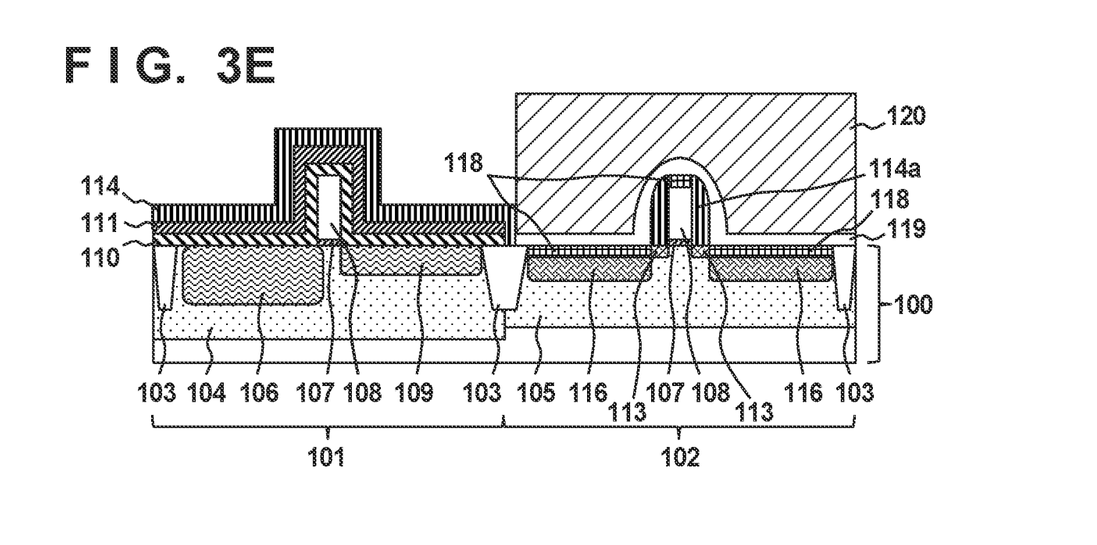
Figure 4A:
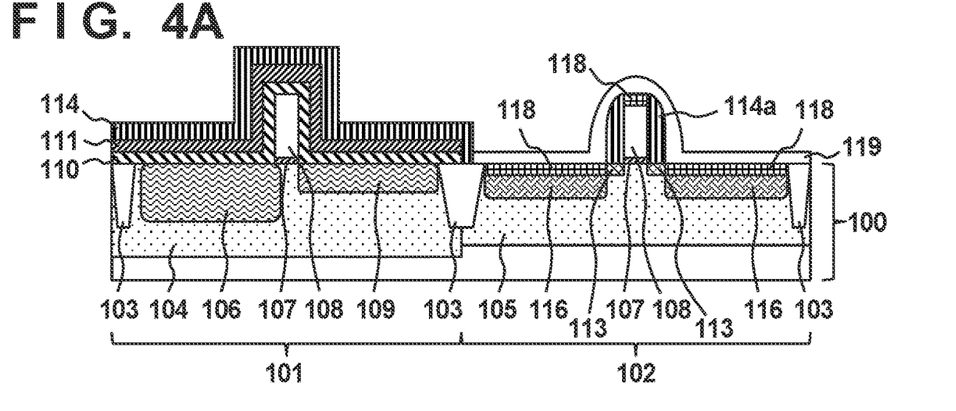
FIGS. 4A to 4C are sectional views showing the method of manufacturing the image capturing apparatus according to the embodiment of the present invention.

After the silicide layers 118 are formed, as shown in FIG. 3C, silicon nitride layers 119 which function as an etch stopper in the peripheral region 102 are formed on the substrate 100 so as to cover the pixel region 101 and the peripheral region 102. Then, as shown in FIG. 3D, a mask pattern 120 which covers the peripheral region 102 is formed, and the silicon nitride layer 119 arranged above the pixel region 101 is removed by dry etching. FIG. 3E is a sectional view showing time when the silicon nitride layer 119 arranged above the pixel region 101 is etched. The silicon nitride layer 119 may be formed on a deposition condition that it functions as a stress liner film of the transistor in the peripheral region 102. It is possible to obtain a structure as shown in FIG. 4A by removing the mask pattern 120 after removing the silicon nitride layer 119 arranged above the pixel region 101.

Figure 4B:
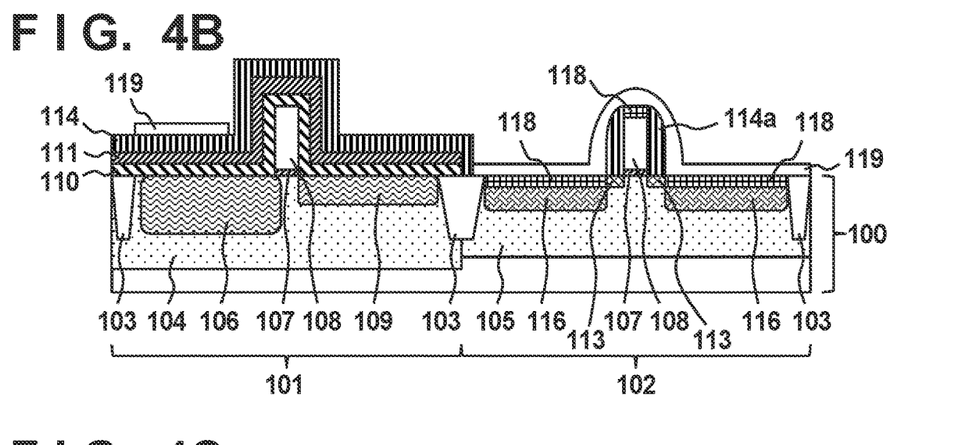
Figure 4C:
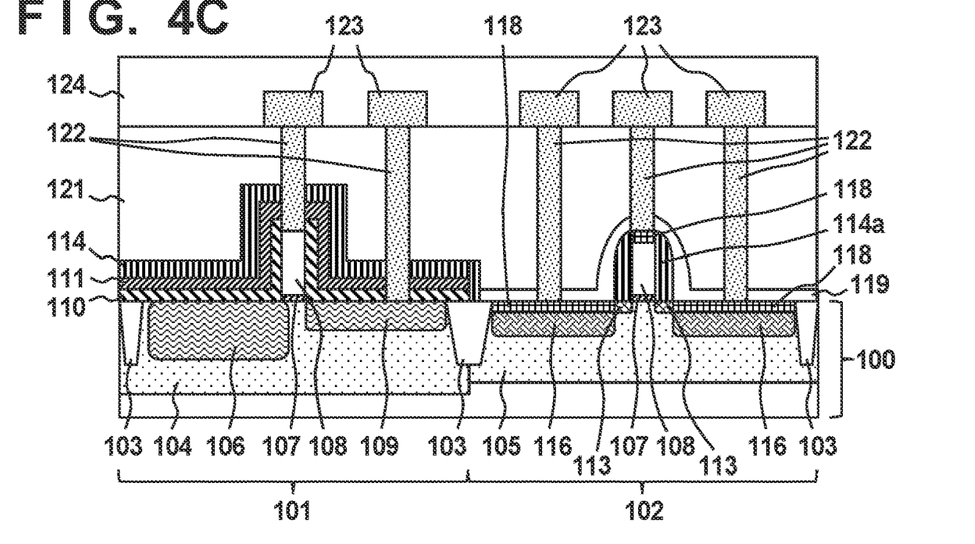

In an arrangement shown in FIG. 3E, the silicon nitride layer 119 arranged in the pixel region 101 is removed completely. However, the present invention is not limited to this. For example, consider a case in which a light waveguide is formed above the photoelectric converter of the pixel region 101. In this case, the silicon nitride layer 119 may be used as an etching stopper film when an opening portion for arranging the light waveguide in an interlayer insulating film formed on the silicon nitride layer 111 is formed. More specifically, as shown in FIG. 4B, the silicon nitride layer 119 of a corresponding portion may remain above the pixel region 101. The silicon nitride layer 119 may not cover the entire peripheral region 102.

Then, an interlayer insulating film 121 is formed. Silicon oxide deposited by, for example, a high-density plasma CVD method may be used for the interlayer insulating film 121. Alternatively, silicon oxide that contains an impurity such as BPSG, BSG, or PSG may be used.

After the interlayer insulating film 121 is formed, in the pixel region 101, the silicon nitride layer 111 is used as an etching stop film, and contact holes for electrically connecting the semiconductor region 109 and the gate electrode 108 are formed in the interlayer insulating film 121. For example, anisotropic dry etching may be used to form the contact holes. The contact holes formed in the semiconductor region 109 can be formed on the semiconductor region 109 by self alignment by causing the silicon nitride layer 111 to function as the side walls. After the contact holes are formed, an impurity may be implanted into the semiconductor region 109 through the opening portions of the contact holes by the ion implantation method such that contact plugs formed in the contact holes and the semiconductor region 109 are electrically connected to each other more reliably.

Next, also in the peripheral region 102, the silicon nitride layer 119 is used as the etching stop film, and contact holes for electrically connecting the gate electrode 108 and the source/drain regions of the transistor in the peripheral region 102 are formed. As in the case of forming the contact holes in the pixel region 101, the contact holes may be formed by using dry etching.

An order in which the contact holes are formed between the pixel region 101 and the peripheral region 102 is not limited to an order in this embodiment. The contact holes may be formed first in the peripheral region 102. Alternatively, the contact holes may be formed at the same time between the pixel region 101 and the peripheral region 102.

Subsequently, each contact plug 122 is formed by filling a corresponding one of the contact holes with an electric conductor. After that, it is possible to obtain a structure shown in FIG. 4C by sequentially forming, with a known method, wiring layers 123 each using an electric conductor such as a metal and an interlayer insulating film 124 on the interlayer insulating film 121 and the contact plugs 122. It is possible to obtain a multilayer wiring structure in which the plurality of wiring layers 123 and the interlayer insulating film 124 are stacked. The insulating film 114, the silicon nitride layer 111, the silicon oxide layer 110, the silicon nitride layer 119, and the side walls 114a are arranged between the substrate 100 and the interlayer insulating film 121 where the contact plugs 122 are provided. Hence, a distance between the substrate 100 and the insulating film 114, the silicon nitride layer 111, the silicon oxide layer 110, the silicon nitride layer 119, and the side walls 114a is smaller than a distance between the substrate 100 and the wiring layers 123. This embodiment has characteristics in arrangements of the insulating film 114, silicon nitride layer 111, silicon oxide layer 110, silicon nitride layer 119, and side walls 114a thus in close vicinities to the substrate 100. By these characteristics, it is possible to provide a technique advantageous in improving the characteristics of the image capturing apparatus.

Furthermore, a passivation film (not shown) that includes a silicon nitride layer, a color filter (not shown), a microlens (not shown), and the like are formed on the interlayer insulating film 124, completing the image capturing apparatus. Note that an opening may be formed in the interlayer insulating films 124 and 121, and a dielectric material such as silicon oxide, silicon nitride, a resin, or the like may be buried in the opening. As shown in FIG. 4B, the silicon nitride layer 119 remaining above the pixel region 101 can be used as an etching stopper when forming the openings in the interlayer insulating film 121. The passivation film can be formed by a plasma CVD method. The passivation film may be formed as an intralayer lens. A hydrogen annealing process for promoting hydrogen supply to the transistors arranged in the pixel region 101 and the peripheral region 102 may be added after the passivation film is formed.

The image capturing apparatus of the structure obtained by the above-described method contains hydrogen and reduces a dark current by covering the photoelectric converter with the silicon nitride layer 111 having the low chlorine concentration in the pixel region 101. It is possible to obtain an antireflection effect in the photoelectric converter by the insulating film formed by the silicon oxide layer 110 and the silicon nitride layer 111. In the peripheral region 102, the side walls 114a are formed by a film different from the silicon nitride layer 111, and there can be a case in which they are formed only by a silicon oxide layer and a case in which they are formed by a silicon nitride layer having a high chlorine concentration. By thus optimizing the arrangements of insulators that cover the pixel region 101 and the peripheral region 102, it is possible to achieve both a reduction in dark current in the photoelectric converter and an improvement in driving force of the transistor. Furthermore, according to the above-described method, the silicon nitride layer 111 can contribute to the termination of a dangling bond in the peripheral region 102 as well by temporarily arranging the silicon nitride layer 111 in the peripheral region 102 as well.

As an application example of the image capturing apparatus according to the embodiment described above, a camera incorporating the image capturing apparatus will be exemplified below. The concept of the camera includes not only an apparatus mainly aiming at shooting but also an apparatus (for example, a personal computer or a portable terminal) having an auxiliary shooting function. The camera includes an image capturing apparatus according to the present invention exemplified as an embodiment above, and a signal processor that processes information based on a signal output from the image capturing apparatus. The signal processor can include a processor that processes digital data as image data. An A/D converter for generating image data as digital data can be provided in the image capturing apparatus or provided separately from the image capturing apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-145682, filed Jul. 27, 2017 which is hereby incorporated by reference wherein in its entirety.

What is claimed is:

1. An image capturing apparatus comprising a pixel region that includes a photoelectric converter and a peripheral region that includes a transistor arranged in a substrate,
   wherein the photoelectric converter is covered with a first silicon nitride layer,
   wherein a side surface of a gate electrode of the transistor is covered with a side wall that includes a second silicon nitride layer, and
   wherein the first silicon nitride layer has a lower chlorine concentration than a chlorine concentration of the second silicon nitride layer.

2. The apparatus according to claim 1, wherein the chlorine concentration of the second silicon nitride layer is not less than 1.0 atom %.

3. The apparatus according to claim 1, wherein the chlorine concentration of the first silicon nitride layer is less than 1.0 atom %.

4. The apparatus according to claim 1, wherein the transistor includes a silicide layer over at least a part of a source/drain region and the gate electrode, and
   wherein in an orthogonal projection to the substrate, the first silicon nitride layer does not overlap with the silicide layer.

5. A camera comprising:
   the image capturing apparatus according to claim 1; and
   a signal processor configured to process a signal obtained by the image capturing apparatus.

6. A method of manufacturing an image capturing apparatus where a pixel region and a peripheral region are arranged, the method comprising:
   forming a first insulating film on at least a photoelectric converter and a first gate electrode of the pixel region and on a second gate electrode of the peripheral region;
   forming a mask pattern configured to cover a portion of the first insulating film located on at least the photoelectric converter and the first gate electrode of the pixel region;
   removing the first insulating film of a portion uncovered with the mask pattern;
   forming a second insulating film above the pixel region and the peripheral region after the removing;
   forming a side wall configured to cover a side surface of the second gate electrode of the peripheral region from the second insulating film by etching the second insulating film so as to expose a top surface of the second gate electrode of the peripheral region;
   forming a third insulating film to cover the side wall and the top surface of the second gate electrode, the third insulating film including a silicon nitride layer;
   forming an interlayer insulating film above the pixel region and the peripheral region, the third insulating film being between the interlayer insulating film and the top surface of the second gate electrode; and
   forming a contact plug in contact with the second gate electrode, the interlayer insulating film, and the third insulating film.

7. The method according to claim 6, wherein the first insulating film includes a first silicon nitride layer,
   wherein the second insulating film includes a second silicon nitride layer, and
   wherein the second silicon nitride layer has a higher chlorine concentration than a chlorine concentration of the first silicon nitride layer.

8. The method according to claim 6, wherein the first insulating film includes a silicon nitride layer and a silicon oxide layer arranged between the photoelectric converter and the silicon nitride layer, and
   wherein the second insulating film includes a silicon oxide layer and does not include a silicon nitride layer.

9. The method according to claim 6, wherein dichlorosilane is used for a source gas when forming the first insulating film, and
   wherein hexachlorodisilane is used for a source gas when forming the second insulating film.

10. The method according to claim 6, wherein in the removing, the first insulating film is removed by wet etching.

11. The method according to claim 6, further comprising:
    forming a metal film so as to cover the pixel region and the peripheral region after the forming the side wall; and
    performing silicidation on a portion of a substrate and the second gate electrode of the peripheral region in contact with the metal film,
    wherein at least one of at least some of source gases used when depositing the first insulating film and the second insulating film, film thicknesses when depositing the first insulating film and the second insulating film, and deposition conditions when depositing the first insulating film and the second insulating film is different,
    wherein in the forming the side wall, the second insulating film arranged above the pixel region remains, and
    wherein in the performing silicidation, at least an edge of the first insulating film is covered with the second insulating film.

12. The method according to claim 6, wherein a temperature for forming the first insulating film is higher than a temperature for forming the second insulating film.

13. An image capturing apparatus comprising a pixel region that includes a photoelectric converter and a first transistor, and a peripheral region that includes a second transistor arranged in a substrate,
    wherein a first silicon nitride layer covers the photoelectric converter and a side surface of a gate electrode of the first transistor,
    wherein a silicon oxide layer is arranged between the photoelectric converter and the first silicon nitride layer, and between the side surface of the gate electrode of the first transistor and the first silicon nitride layer,
    wherein the side surface of the gate electrode of the first transistor includes a first part and a second part, and the first part is closer to a top surface of the gate electrode of the first transistor than is the second part,
    wherein a distance between the first silicon nitride layer and the second part is not more than a distance between the first silicon nitride layer and the substrate, wherein a side surface of a gate electrode of the second transistor is covered with a side wall that includes a silicon oxide layer, wherein the side wall is covered with an insulating film that contacts the side wall and the substrate, wherein the side wall does not include a silicon nitride layer having a chlorine concentration that is equal to or less than a chlorine concentration of the first silicon nitride layer, and wherein a second silicon nitride layer covers the photoelectric converter, a silicon oxide layer is arranged between the first silicon nitride layer and the second silicon nitride layer, and a distance between the first silicon nitride layer and the second silicon nitride layer is less than a thickness of the gate electrode of the first transistor.

14. The apparatus according to claim 13, wherein the chlorine concentration of the first silicon nitride layer is less than 1.0 atom %.

15. The apparatus according to claim 13, wherein the side wall further comprises a silicon nitride layer having a chlorine concentration that is greater than the chlorine concentration of the first silicon nitride layer.

16. The apparatus according to claim 13, wherein the first silicon nitride layer contains chlorine.

17. The apparatus according to claim 13, wherein the substrate and the gate electrode of the second transistor include a silicide layer, wherein the insulating film includes a silicon nitride layer, and wherein in an orthogonal projection to the substrate, the first silicon nitride layer does not overlap with the silicide layer of the gate electrode.

18. The apparatus according to claim 13, wherein the side wall is arranged between the side surface of the gate electrode of the second transistor and the insulating film and in contact with the side surface of the gate electrode of the second transistor, a top surface of the gate electrode of the second transistor is made of a silicide layer, and the insulating film includes a silicon nitride layer.

19. A camera comprising:

the image capturing apparatus according to claim 13; and a signal processor configured to process a signal obtained by the image capturing apparatus.

* * * * *